(12) United States Patent
Verdy

(10) Patent No.: US 12,349,370 B2
(45) Date of Patent: Jul. 1, 2025

(54) ELEMENTARY CELL COMPRISING A RESISTIVE MEMORY AND A DEVICE INTENDED TO FORM A SELECTOR, CELL MATRIX, ASSOCIATED MANUFACTURING AND INITIALIZATION METHODS

(71) Applicant: COMMISSARIAT À L'ÉNERGIE ATOMIQUE ET AUX ÉNERGIES ALTERNATIVES, Paris (FR)

(72) Inventor: Anthonin Verdy, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 157 days.

(21) Appl. No.: 17/785,699

(22) PCT Filed: Dec. 11, 2020

(86) PCT No.: PCT/EP2020/085701
§ 371 (c)(1),
(2) Date: Jun. 15, 2022

(87) PCT Pub. No.: WO2021/122358
PCT Pub. Date: Jun. 24, 2021

(65) Prior Publication Data
US 2023/0047263 A1 Feb. 16, 2023

(30) Foreign Application Priority Data
Dec. 16, 2019 (FR) ...................................... 1914466

(51) Int. Cl.
*H10B 63/00* (2023.01)
*G11C 13/00* (2006.01)
(Continued)

(52) U.S. Cl.
CPC ........... *H10B 63/24* (2023.02); *G11C 13/003* (2013.01); *G11C 13/0069* (2013.01);
(Continued)

(58) Field of Classification Search
CPC ...... H10B 63/24; H10B 63/80; G11C 13/003; G11C 13/0069; G11C 2013/0083;
(Continued)

(56) References Cited

U.S. PATENT DOCUMENTS 11,552,810 B2 * 1/2023 Cambou ............... H04L 9/3278
2013/0010530 A1 * 1/2013 Katayama ............ H10N 70/026
365/148

(Continued)

OTHER PUBLICATIONS

International Search Report as issued in International Patent Application No. PCT/EP2020/085701, dated Feb. 2, 2021.

*Primary Examiner* — Donald H B Braswell
(74) *Attorney, Agent, or Firm* — Pillsbury Winthrop Shaw Pittman LLP

(57) ABSTRACT

An elementary cell includes a device and a non-volatile resistive memory mounted in a series, the device including an upper selector electrode, a lower selector electrode, a layer made up of a first active material, referred to as an active selecting layer, the device being intended to form a volatile selector; the memory including an upper memory electrode, a lower memory electrode, a layer made of at least a second active material, referred to as an active memory layer, the active selecting layer being in a conductive crystalline state and the memory being in a very strongly resistive state that is more resistive than the strongly resistive state of the memory.

11 Claims, 8 Drawing Sheets

(51) Int. Cl.
*H10N 70/00* (2023.01)
*H10N 89/00* (2023.01)

(52) U.S. Cl.
CPC ........... *H10N 70/063* (2023.02); *H10N 89/00* (2023.02); *G11C 2013/0083* (2013.01); *G11C 2213/72* (2013.01); *G11C 2213/76* (2013.01)

(58) Field of Classification Search
CPC ............ G11C 2213/72; G11C 2213/76; H10N 70/063; H10N 89/00; H10N 70/231; H10N 70/24; H10N 70/245; H10N 70/882; H10N 70/8833
See application file for complete search history.

(56) References Cited

U.S. PATENT DOCUMENTS

| | | | |
|---|---|---|---|
| 2016/0365144 A1* | 12/2016 | Ueki ................... | G11C 13/0069 |
| 2017/0117328 A1* | 4/2017 | Terai ................... | H10N 70/231 |
| 2017/0148987 A1 | 5/2017 | Sills et al. | |
| 2018/0277601 A1 | 9/2018 | Ahn et al. | |
| 2019/0392897 A1* | 12/2019 | Lu ...................... | G11C 13/0026 |
| 2020/0211646 A1* | 7/2020 | Cho ................... | G11C 13/0069 |
| 2020/0294584 A1* | 9/2020 | Al-Shamma ........... | H10B 63/30 |
| 2021/0043837 A1* | 2/2021 | Manfrini ................ | G11C 11/15 |

\* cited by examiner

ELEMENTARY CELL COMPRISING A RESISTIVE MEMORY AND A DEVICE INTENDED TO FORM A SELECTOR, CELL MATRIX, ASSOCIATED MANUFACTURING AND INITIALIZATION METHODS

CROSS-REFERENCE TO RELATED APPLICATIONS

This application is the U.S. National Stage of PCT/EP2020/085701, filed Dec. 11, 2020, which in turn claims priority to French patent application number 1914466 filed Dec. 16, 2019. The content of these applications are incorporated herein by reference in their entirety.

TECHNICAL FIELD OF THE INVENTION

The technical field of the invention is that of elementary cells comprising a resistive memory in series with a selector device.

The present invention relates to an elementary cell comprising a resistive memory in series with a device intended to form a selector and a matrix comprising a plurality of elementary cells. The present invention also relates to a matrix comprising a plurality of elemental cells, a manufacturing method for obtaining the matrix, and a method for initializing the elemental cell or the matrix.

TECHNOLOGICAL BACKGROUND OF THE INVENTION

For applications that require information storage that is resistant to voltage interruptions, rewritable non-volatile resistive memories are commonly used. These are based on active materials such as ionic conduction materials (CBRAM or "Conductive Bridging RAM" memories), metal oxide materials (OxRAM or "Oxide Resistive RAM" memories), ferroelectric materials (FERAM or "Ferroelectric RAM" memories), magnetic materials (MRAM or "Magnetic RAM" memories), magnetic spin transfer materials (STTRAM or "Spin Torque Transfer RAM" memories) or phase change materials (PCRAM or "Phase Change RAM" memories). These memories are resistive type memories, that is they can have at least two resistive states, corresponding to a high resistance state ("HRS" state) and a low resistance state ("LRS" state), when a voltage is applied.

Resistive memories need two electrodes to operate. For example, CBRAM memories comprise an active region based on an ionic conduction material forming an ionic conduction solid electrolyte disposed between an electrode forming an inert cathode and an electrode comprising a portion of ionizable metal, that is, a portion of metal that can readily form metal ions, and forming an anode. The operation of CBRAM memories is based on the formation, within the solid electrolyte, of one or more metal filaments (also called "dendrites") between its two electrodes when these electrodes are brought to appropriate potentials. The formation of the filament allows a given electrical conduction to be obtained between the two electrodes. By modifying the potentials applied to the electrodes, it is possible to modify the distribution of the filament, and thus to modify the electrical conduction between the two electrodes.

PCRAM memories include an active zone based on a chalcogenide material. The operation of PCRAM memories is based on the phase transition of the chalcogenide material, induced by the heating of this material under the effect of specific electric pulses applied between the two electrodes. This transition takes place between an ordered crystalline phase, of low resistance and thermodynamically stable and a disordered amorphous phase, of high resistance and thermodynamically unstable.

OxRAM memories have an M-I-M (Metal-Insulator-Metal) structure comprising an active material of variable electrical resistance, generally a transition metal oxide (for example $HfO_2$, $Ta_2O_5$, $TiO_2$ ... ), disposed between two metal electrodes. The change from the "HRS" state to the "LRS" state is governed by the formation and breakage of a conductive filament of nanometric section between the two electrodes.

Resistive memories have the particular advantage of being able to integrate with high densities, via a "cross-bar" type integration (also known as "cross-point").

FIG. 1 Such an architecture 200 is illustrated in FIG. 1 and comprises a plurality of access lines 201, 202, 203, 204 and a plurality of rewritable non-volatile memory cells (here four cells C11, C21, C22, C12) based on active materials (for example CBRAM cells). The access lines are formed by parallel upper bit lines 201, 202 and lower word lines 203, 204 perpendicular to the bit lines, with the elementary cells C11, C21, C22, C12 sandwiched at the intersection between the bit lines 201, 202 and the word lines 203, 204. The architecture 200 thus forms an array where each memory cell is individually addressable, by selecting the correct bit line and word line.

To avoid parasitic leakage currents passing through adjacent cells during the read phase the state of a cell performed by biasing the desired row and column, it is known to add a selector device in series with each of the cells. In this case, the selector devices block the passage of the parasitic current, thus allowing only the current induced by the biasing of the bit line and the word line (application of a potential difference Vbias between these two lines).

In the literature, different types of selector devices can be found, such as FAST ("Field Assisted Superlinear Threshold"), MIEC ("Mixed-Ionic-Electronic Conduction") and OTS ("Ovonic Threshold Switching"). A selector device consists of two electrodes and an active material, the electrodes being disposed on either side of the active material and allowing a voltage to be applied to this active material. In the case of an OTS type selector, the active material can be a chalcogenide alloy, generally in an amorphous state.

FIG. 2 The basic principle of operation of a selector device is represented in FIG. 2. The device is highly resistive in the OFF state. As soon as a voltage higher than a threshold voltage Vth is applied to it, the current increases rapidly to reach the ON state of the device, a low resistive state. As soon as the current or voltage is reduced below a specific so-called holding value Ih, the device becomes OFF again.

Before being able to operate in their nominal mode, the selector and possibly the resistive memory of an elementary cell have to be initialized, initialization consisting in applying an initialization voltage across the element to be initialized.

Conventionally, the initialization of the resistive memory and of the selector is carried out simultaneously during the same operation by applying an initialization voltage having a value generally in the order of the sum of the voltage necessary to initialize the resistive memory alone and the voltage necessary to initialize the selector alone.

However, such an initialization voltage is generally higher than the threshold voltage of the selector and especially than the programming voltage of the resistive memory, which is likely to damage it.

A known way to protect the resistive memory during the initialization of the cell is to use a specific circuitry, but this makes the operation of the elementary cell more complex and generates additional costs.

There is therefore a need to initialize an elementary cell comprising a selector device in series with a resistive memory without having to resort to additional circuits.

SUMMARY OF THE INVENTION

The invention provides a solution to the previously mentioned problems, by making it possible to initialize an elementary cell without using dedicated circuitry.

A first aspect of the invention relates to an elementary cell comprising a device and a non-volatile resistive memory connected in series, the device comprising:
- a selector upper electrode,
- a selector lower electrode
- a layer made of a first active material, called the active selecting layer, said device being intended to form a volatile selector switching from a first resistive selector state to a second resistive selector state by applying a threshold voltage between the selector upper electrode and the selector lower electrode and switching back to the first resistive selector state as soon as the current flowing through it or the voltage across the selector upper electrode and the selector lower electrode becomes again less than a holding current or voltage respectively, the first resistive selector state being more resistive than the second resistive selector state, said memory comprising:
- a memory upper electrode,
- a memory lower electrode,
- a layer made of at least one second active material, called the active memory layer, said memory switching from a first resistive memory state to a second resistive memory state by applying a voltage or a current between the memory upper electrode and the memory lower electrode.

said active selecting layer being in a conductive crystalline state and said memory being in an initial resistive memory state, the initial resistive memory state being more resistive than the first resistive memory state and the second resistive memory state.

By virtue of the invention, the elementary cell can be initialized by applying an initialization or forming voltage lower than the programming voltage of the elementary cell, without having to resort to an additional circuit. The electrical insulation of the cell between manufacture and initialization is provided by the resistive memory in the initial resistive state which is a very high resistive state, and not as conventionally done by the selector device in its high resistive OFF state.

The first resistive selector state corresponds to the OFF state of the selector device, the second resistive selector state corresponds to the ON state of the selector device, and the first and second resistive memory states correspond to the HRS and LRS states of the resistive memory, previously defined.

In addition to the characteristics just mentioned in the preceding paragraph, the elementary cell according to the first aspect of the invention may have one or more complementary characteristics among the following, considered individually or according to any technically possible combinations:
- the device is intended to form an OTS type selector;
- the resistive memory is of the PCRAM, OxRAM or CbRAM type;
- the selector upper electrode is the memory lower electrode.

A second aspect of the invention relates to a matrix comprising a plurality of cells according to the first aspect of the invention, a plurality of upper access lines and a plurality of lower access lines, each cell being located at an intersection between an upper access line and a lower access line allowing its individual addressing.

Thus, the elementary cell according to the first aspect of the invention is compatible with a high integration density structure.

A third aspect of the invention relates to a method for manufacturing a matrix according to the second aspect of the invention, comprising the following steps of:
- conformally depositing a first dielectric material layer;
- manufacturing a plurality of lower metal lines forming the lower selector electrodes of the elementary cells of the matrix, by damascene of the first dielectric material layer;
- conformally depositing, on the first dielectric material layer, an active selecting layer in a crystalline state or in an amorphous state, a selector upper electrode layer, a memory lower electrode layer, an active memory layer and then a memory upper electrode layer;
- etching at least one first trench with a stop on the first dielectric material layer;
- filling with a second dielectric material layer so as to fill in the first trench;
- planarizing with a stop on the parts of the memory upper electrode layer that have not been etched;
- etching at least one second trench perpendicular to the first trench with a stop on the first dielectric material layer;
- filling the second trench with a third dielectric material layer so as to fill in the second trench;
- manufacturing a plurality of upper metal lines by damascene on the third dielectric material layer;
- the method including annealing when the active selecting layer is deposited in an amorphous state.

Thus, according to a first embodiment, the active selecting layer is deposited in a crystalline state by epitaxy, which allows better control of the thickness of the active selecting layer and avoids the problems of homogeneity of a material deposited amorphous and then crystallized. According to a second embodiment, the active selecting layer is deposited in an amorphous state by a conventional deposition method which facilitates the implementation of the method and is followed by annealing to crystallize the active selecting layer.

According to one alternative of the second embodiment, annealing is performed during the step of filling with a second dielectric material layer or during the step of manufacturing the upper metal line.

According to one alternative compatible with the preceding embodiments and alternatives, the method according to the third aspect of the invention comprises a step of conformally depositing a carbon layer before and after the deposition of the active selecting layer.

Thus, the interaction between the active selecting layer and its electrodes is limited and the endurance of the selector device is improved.

According to one alternative compatible with the preceding embodiments and alternatives, the deposition of the selector upper electrode layer is the deposition of the memory lower electrode layer.

A fourth aspect of the invention relates to a method for initializing a cell according to the first aspect of the invention or each cell of a matrix according to the second aspect of the invention comprising a step of applying an initialization current and a single voltage pulse having an intensity equal to a predetermined initialization voltage and predetermined fall time between the memory upper electrode and the selector lower electrode.

Thus, the initialization voltage is selected to initialize the memory, the current applied during initialization or initialization current allows melting of the crystalline active selecting layer, and the fall time of the pulse is selected to allow quenching of the active selecting layer, which allows for amorphization of the selector device to place the selector device in its high resistive OFF state. The selector device can then perform its function of electrical insulation of the cell.

The invention and its various applications will be better understood upon reading the following description and examining the accompanying figures.

BRIEF DESCRIPTION OF THE FIGURES

The figures are set forth as indicating and in no way limiting purposes of the invention.

DETAILED DESCRIPTION OF AT LEAST ONE EMBODIMENT OF THE INVENTION

Unless otherwise specified, the same element appearing in different figures has a unique reference.

Figure 1:
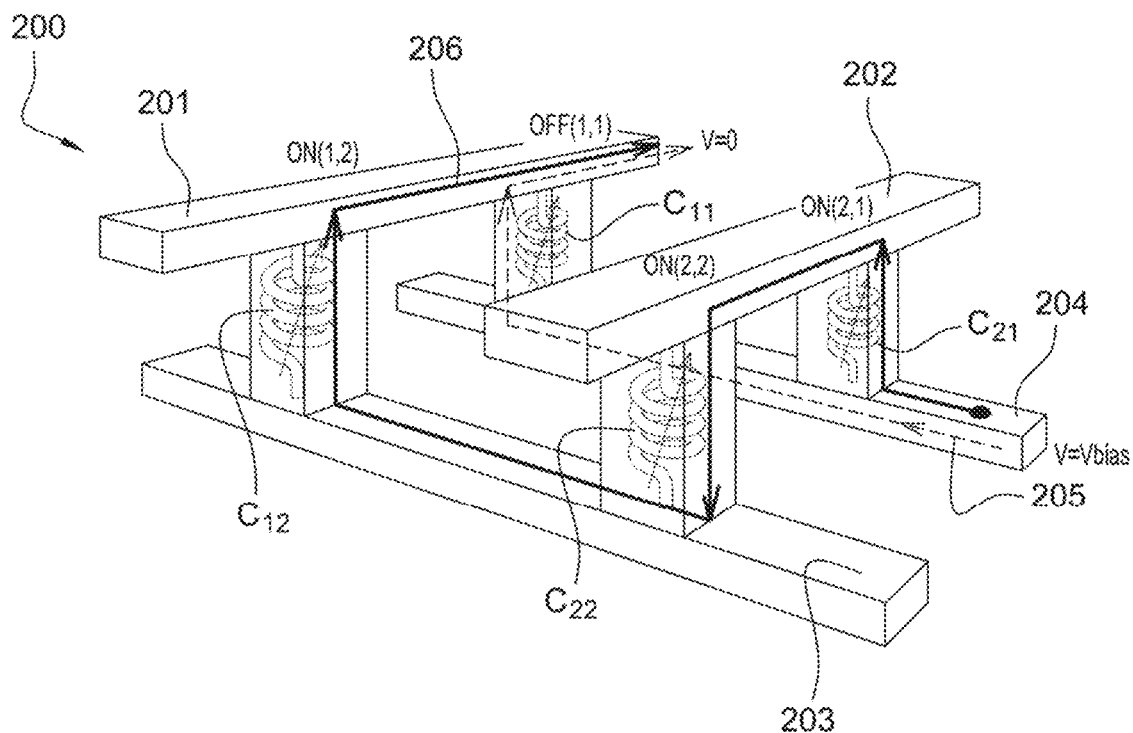
FIG. 1 represents an addressing architecture of a plurality of memory cells according to prior art.
Figure 2:
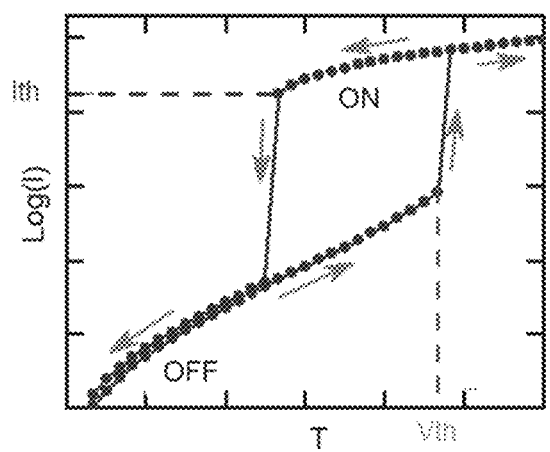
FIG. 2 shows a graph explaining the operating principle of a selector device.

FIGS. 1 and 2 have already been described with reference to prior art.

Figure 3:
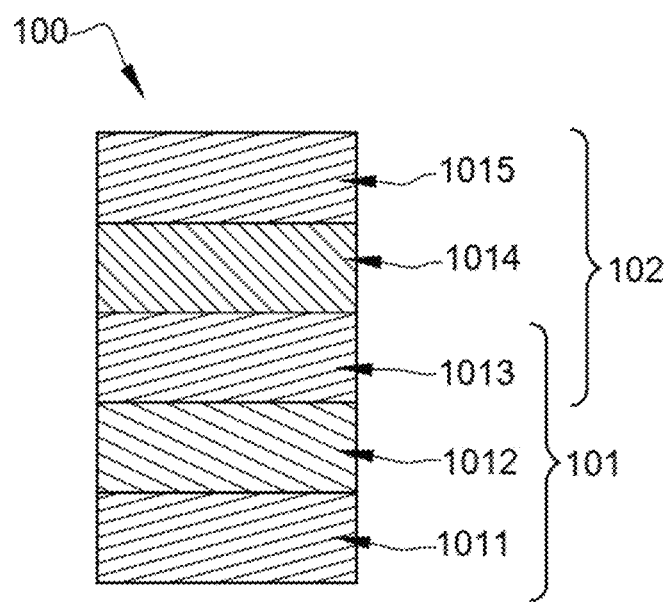
FIG. 3 shows a schematic representation of an elementary cell according to the first aspect of the invention.

FIG. 3 A first aspect of the invention illustrated in FIG. 3 relates to an elementary cell 100 comprising a selector stack for addressing a non-volatile resistive memory 102 when integrated within a cross-bar type architecture.

The elementary cell 100 comprises:
  A conductive material layer forming a selector lower electrode 1011;
  A layer made of a first active material, called the active selecting layer 1012;
    A conductive material layer, forming a selector upper electrode and a memory lower electrode;
    A layer made of at least one second active material, called the active memory layer 1014;
  A conductive material layer, forming a memory upper electrode 1015.

According to the example embodiment illustrated in FIG. 3, the selector upper electrode conductive material layer and the memory lower electrode conductive material layer are the same layer 1013, but it is also possible to have two distinct layers to form these elements.

The first active material is intended to form a selector device 101 and the second active material is capable of forming a resistive memory 102, the selector device 101 and the resistive memory 102 each requiring an upper electrode and a lower electrode to ensure their operation.

An upper electrode of a device is defined as the electrode above this device and the lower electrode of a device is defined as the electrode below this device, the electrodes being located on either side of the device. Of course, the adjectives "upper" and "lower" here are relating to the orientation of the assembly including the upper electrode, the device, and the lower electrode so that by turning this assembly over, the electrode previously referred to as the upper electrode becomes the lower electrode and the electrode previously referred to as the lower electrode becomes the upper electrode.

The material or materials of the active memory layer 1014 are chosen according to the type of memory desired, for example, a PCRAM, OxRAM or even CBRAM type memory: this choice then conditions the choice of the conductive materials of the electrodes 1013, 1015 of the memory 102. Indeed, for example, for a CBRAM to operate, it needs two electrodes arranged on either side of its ionic conduction active material, including one electrode comprising a portion of ionizable metal, that is a portion of metal that can easily form metal ions. The electrodes are, for example, made of Ag or Cu.

For a PCRAM memory, the material of the active memory layer 1014 is, for example, In—Ge—Sb—Te, Ga—Sb, Ge—Sb, Ga—Sb—Te, Ti—Sb—Te, Ge—Sb—Se—Te, Si—Sb—Te, Ge—Sb—Te, Sb—Te or Ge—Te. The thickness of the active memory layer 1014 is for example between 50 and 100 nm.

For a CBRAM memory, the material of the active memory layer 1014 is for example Ge—S, Ge—Se, Cu—S, Ag—S, Ta—O, Si—O, W—O.

The active memory layer 1014 may include, for example, a first sublayer of $Al_2O_3$ and a second sub-layer of Cu—Te—Ge. The first sublayer has, for example, a thickness of 3.5 nm and the second sublayer has, for example, a thickness of 20 nm.

For an OxRAM memory, the material of the active memory layer 1014 is for example Hf—O, Ta—O, Ti—O, Al—O.

The active memory layer 1014 may comprise, for example, a first sublayer of $HfO_2$ and a second sublayer of Ti. The first sublayer has, for example, a thickness of 5 to 10 nm and the second sublayer has, for example, a thickness of 5 to 10 nm.

Within the elementary cell 100, prior to initialization, that is, after manufacture, the active selecting layer 1012 is in a crystalline conductive state and the resistive memory 102 is in an initial resistive state, more resistive than its high resistive HRS state.

The material of the active selecting layer 1012 is, for example, chosen so that the selector device to be formed is of the OTS type. For example, the active selecting layer 1012 is made of Ge—Se, As—Te—Al, Ge—Se—Te, Ge—Se—Sb, As—Ge—Te, As—Ge—Te—Si, Si—Te, C—Te, Al—Te, B—Ta, Ge—Te, or As—Ge—Se—Te The thickness of the selecting layer 1012 is, for example, 15 to 50 nm.

The properties of the selector, such as its threshold voltage or holding intensity, can be adjusted by the thickness and composition of the active selecting layer 1012.

The active selecting layer 1012 can be sandwiched between two carbon layers. The carbon layers have a thickness of, for example, 3 to 15 nm.

The material used for the electrodes 1011, 1013, 1015 is, for example, TiN, TaN, W, Cu, TiWN, TiSiN or WN.

The electrodes 1011, 1013, 1015 may all consist of the same material or may consist of different materials.

Figure 12:
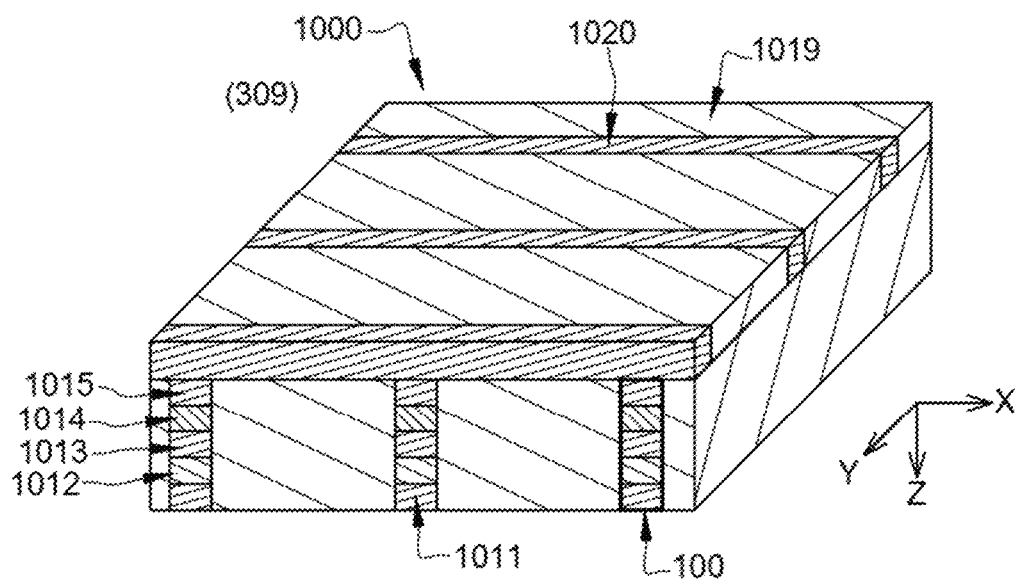
FIG. 12 shows a schematic representation of the ninth step of the manufacturing method according to the third aspect of the invention, for obtaining a matrix according to the second aspect of the invention.

FIG. 12 A second aspect of the Invention relates to a matrix 1000 illustrated in FIG. 12 comprising a plurality of elementary cells 100.

Figure 13:
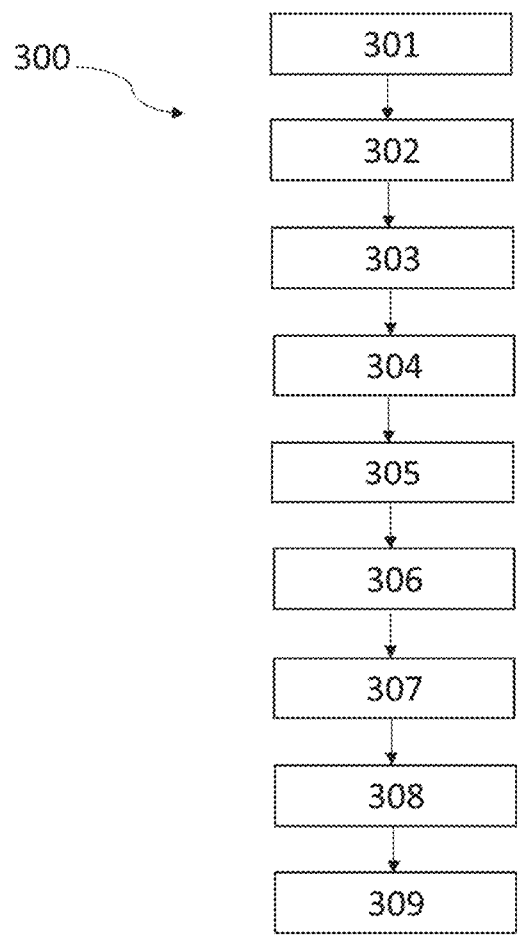
FIG. 13 shows a block diagram representing the sequence of steps of the manufacturing method according to the third aspect of the invention.

FIG. 13 is a block diagram illustrating the sequence of steps 301 to 309 of a method 300 for manufacturing the matrix 1000 according to a third aspect of the invention.

Figure 4:
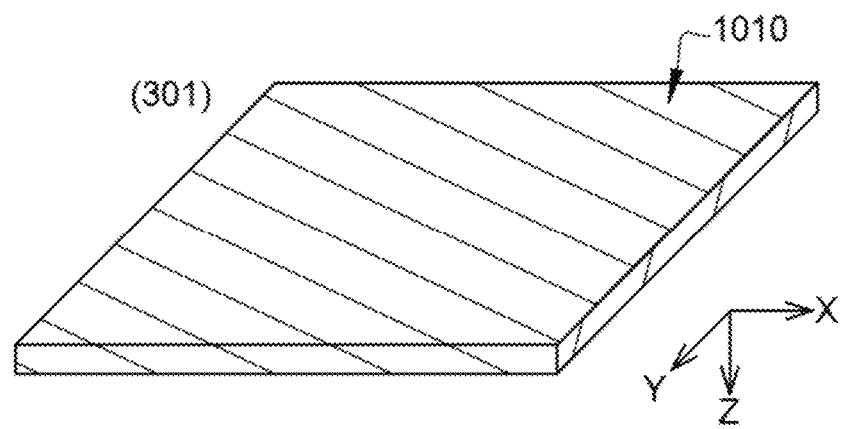
FIG. 4 shows a schematic representation of the first step of the manufacturing method according to the third aspect of the invention.

FIG. 4 illustrates the first step 301 of the method 300, which consists in performing conformal deposition of a first dielectric material layer 1010. Conformal deposition means that the material is deposited evenly over an entire surface. The plane along which the first dielectric material layer 1010 extends contains the direction $\vec{x}$ and the direction $\vec{y}$. The orthogonal reference frame ($\vec{x}$; $\vec{y}$; $\vec{z}$) defines the sides of the matrix 1000 if it is rectangular parallelepipedal in shape. The dimension of the layers along the direction $\vec{z}$ is called the thickness.

The dielectric material of the first dielectric material layer 1010, like the materials of the other dielectric material layers, is, for example, SiN, $SiO_2$, SiC, SiON, SiCN or SiHN. The deposition of this step 301 as well as those of the following deposition steps can be a Physical Vapor Deposition or PVD, a Chemical Vapor Deposition or CVD, or an Atomic Layer Deposition or ALD.

Figure 5:
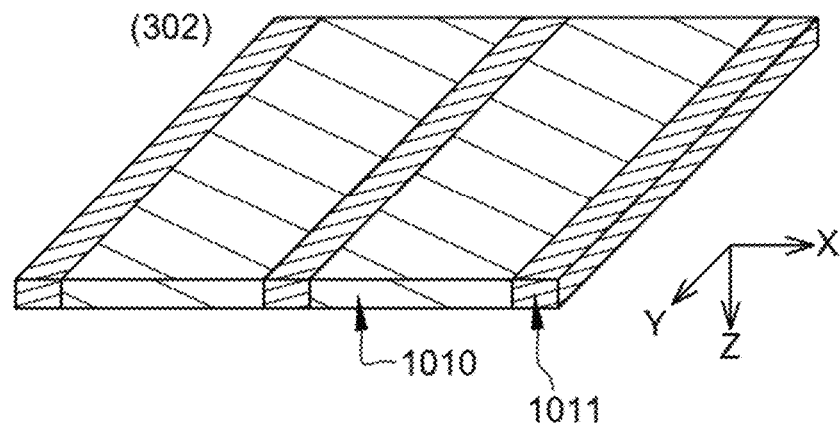
FIG. 5 shows a schematic representation of the second step of the manufacturing method according to the third aspect of the invention.

FIG. 5 illustrates the second step 302 of the method 300 consisting in performing a damascene of the first dielectric material layer 1010. By "damascene" it is meant the method consisting in filling a trench, previously formed in a dielectric material, with conductive material, followed by a mechanochemical polishing. The damascene is for example made with copper Cu. Thus, the first dielectric material layer 1010 includes exposed lower metal lines 1011, allowing metal contacts to be made with an upper layer. The lower metal lines constitute the selector lower electrodes 1011 of the elementary cells 100 of the matrix 1000.

Figure 6:
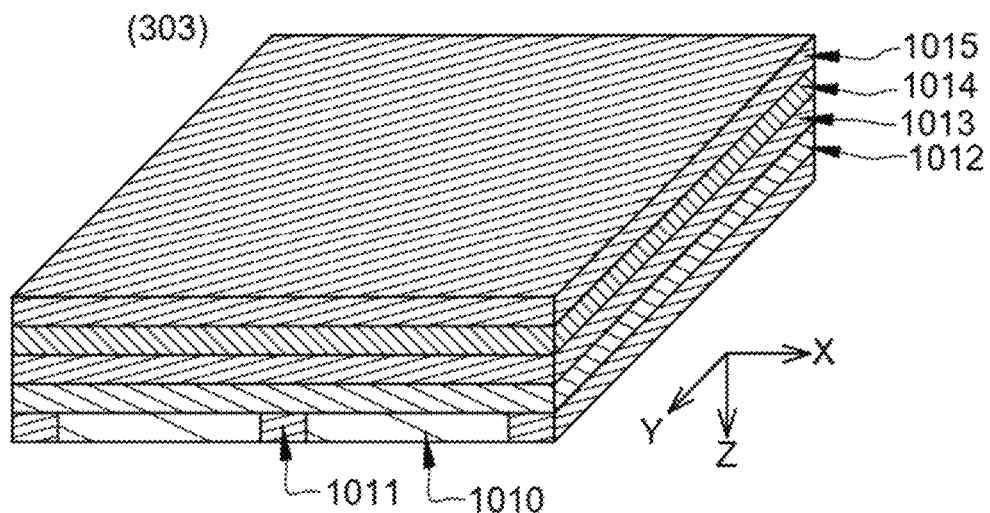
FIG. 6 shows a schematic representation of the third step of the manufacturing method according to the third aspect of the invention.

FIG. 6 illustrates the third step 303 of the method 300 consisting in performing conformal deposition on the first dielectric material layer 1010 comprising lower metal lines 1011. This third step 303 comprises conformal deposition of an active selecting layer 1012, then conformal deposition of a conductive material layer 1013 forming both the selector upper electrode and the memory lower electrode, then conformal deposition of an active memory layer 1014, then conformal deposition of a memory upper electrode conductive material layer 1015.

In the case where the selector upper electrode is distinct from the memory lower electrode, the third step 303 of the method 300 includes conformal deposition of an active selecting layer 1012, then conformal deposition of a first conductive material layer forming the selector upper electrode, then of a second conductive material layer forming the memory lower electrode, followed by conformal deposition of an active memory layer 1014, then conformal deposition of a memory upper electrode conductive material layer 1015.

The third step 303 of the method 300 may additionally include conformal deposition of a first carbon layer on the first dielectric material layer 1010 comprising lower metal lines 1011 and a second carbon layer on the active selecting layer 1012 such that the active selecting layer 1012 is sandwiched between the first and second carbon layers.

According to a first embodiment, the active selecting layer 1012 is deposited directly in the crystalline state by epitaxy. By "epitaxy" it is meant the method of growing a crystal or polycrystal.

According to a second embodiment, the active selecting layer 1012 is deposited in an amorphous state by conventional deposition techniques, such as PVD, CVD or ALD. The material of the active selecting layer 1012 is then chosen to have a crystallization temperature compatible with the integration temperatures. However, according to this second embodiment, annealing will be carried out during the manufacture of the cell, so as to make this active selecting layer 1012 crystalline, after manufacture.

Figure 7:
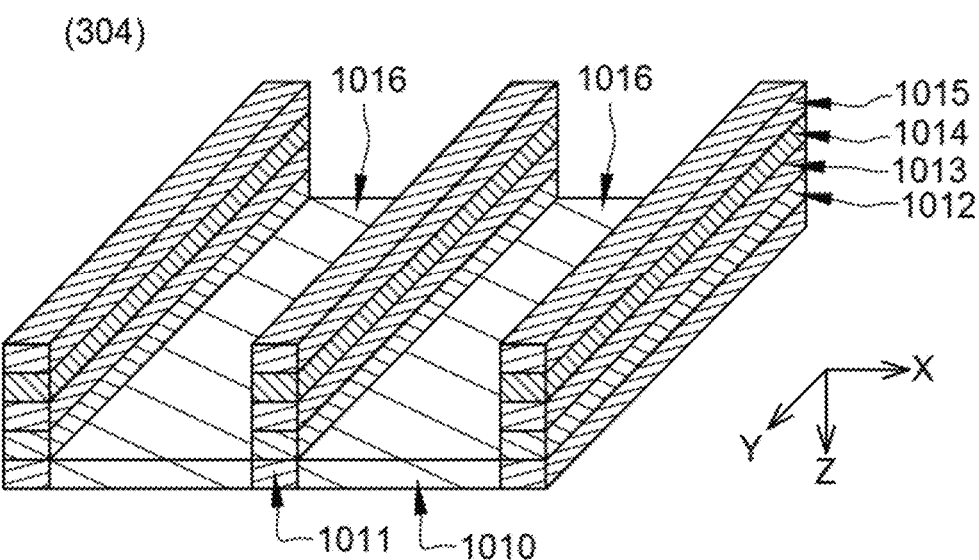
FIG. 7 shows a schematic representation of the fourth step of the manufacturing method according to the third aspect of the invention.

FIG. 7 illustrates the fourth step 304 of the method 300 consisting in etching at least one first trench 1016 with a stop on the first dielectric material layer 1010. Etching is, for example, performed by photo-etching or lithography.

The first trench 1016 extends along its length along the direction $\vec{y}$. The first trench 1016 is etched so that the unetched parts are substantially the same height after etching. In the case of a plurality of first trenches 1016, the first trenches 1016 are all parallel to each other and the etching depth is the same for all first trenches 1016.

Figure 8:
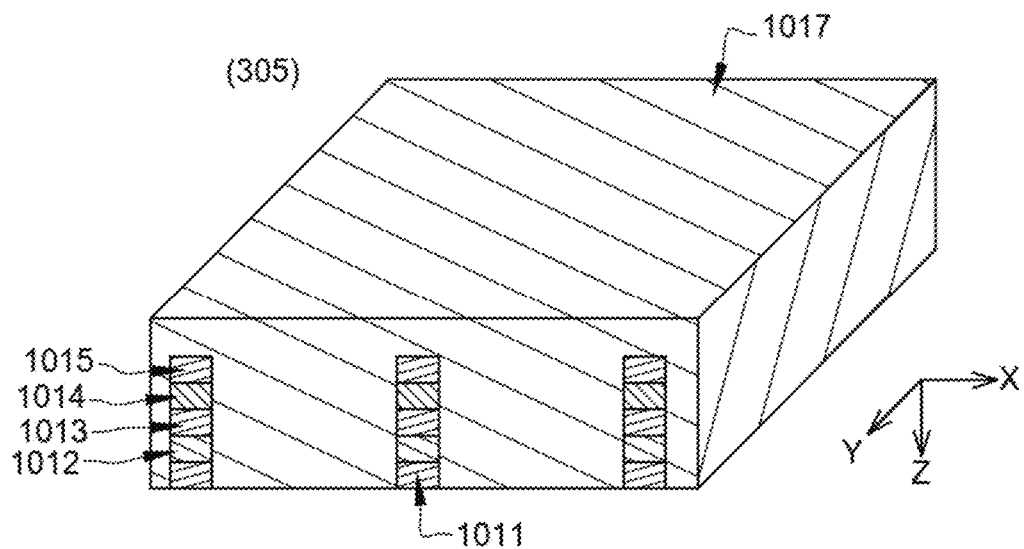
FIG. 8 shows a schematic representation of the fifth step of the manufacturing method according to the third aspect of the invention.

FIG. 8 illustrates the fifth step 305 of the method 300 consisting in encapsulating the stack of FIG. 7. More specifically, this fifth step 305 consists in filling the previously etched first trench 1016 and covering the parts of the memory upper electrode conductive material layer 1015 that have not been etched in the previous etching step 304, with a second dielectric material layer 1017. Filling is, for example, performed by plasma enhanced chemical vapor deposition or PECVD at a temperature of 350° C.

Figure 9:
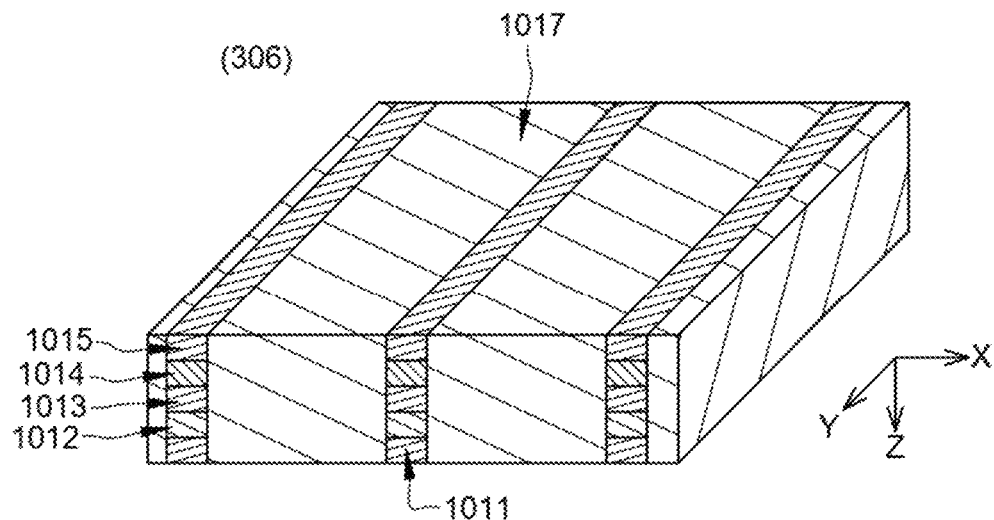
FIG. 9 shows a schematic representation of the sixth step of the manufacturing method according to the third aspect of the invention.

FIG. 9 illustrates the sixth planarization step 306 of the method 300 consisting in removing material with a stop on the parts of the memory upper electrode conductive material layer 1015 that have not been etched in the etching step 304 so as to obtain a planar layer, in a plane containing the directions $\vec{x}$ and $\vec{y}$. Planarization is, for example, achieved by planarizing polishing.

Figure 10:
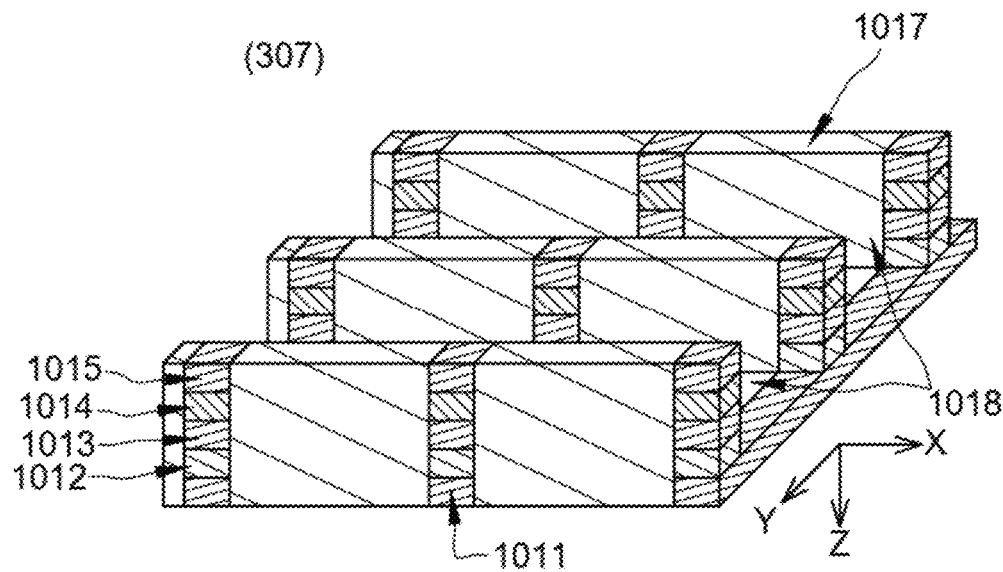
FIG. 10 shows a schematic representation of the seventh step of the manufacturing method according to a third aspect of the invention.

FIG. 10 illustrates the seventh step 307 of the method 300 consisting in etching at least one second trench 1018 along a direction, here along $\vec{x}$, perpendicular to $\vec{y}$, with a stop on the first dielectric material layer 1010. In case of a plurality of second trenches 1018, the second trenches 1018 are parallel to each other and the etching depth is substantially the same for all second trenches 1018. The second trench 1018 is etched such that the unetched parts are substantially the same height after the second trench 1018 extends, along its length, perpendicular to the first trench 1016, that is, along the axis $\vec{x}$.

Figure 11:
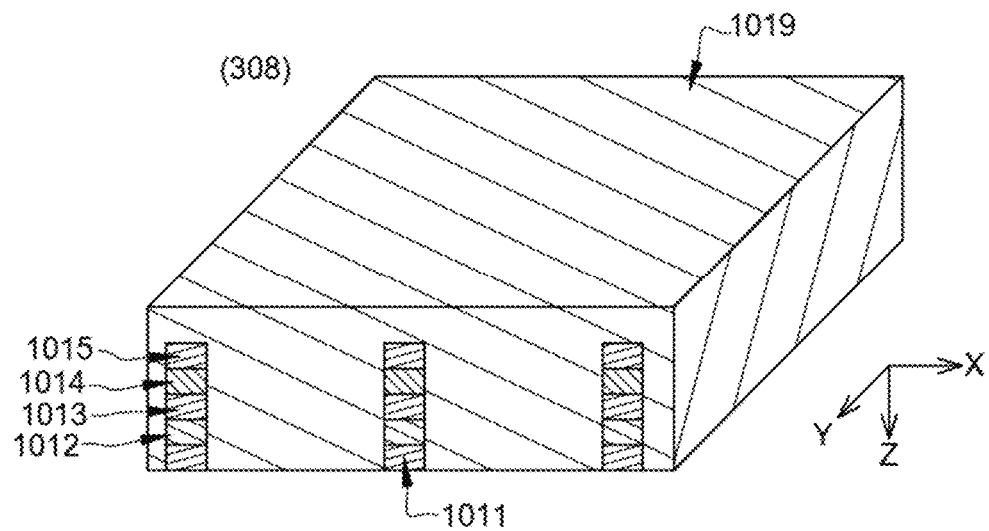
FIG. 11 shows a schematic representation of the eighth step of the manufacturing method according to the third aspect of the invention.

FIG. 11 illustrates the eighth step 308 of the method 300 consisting in encapsulating the stack illustrated in FIG. 10. This eighth step 308 consists in filling the previously etched second trench 1018 and covering the parts of the memory upper electrode conductive material layer 1015 that have not been etched in etching steps 304, 308 with a third dielectric material layer 1019.

FIG. 12 illustrates the ninth step 309 of the method 300 consisting in performing damascene of the third dielectric material layer 1019 to form upper metal lines 1020.

According to the second embodiment, in which the active selecting layer 1012 is deposited in an amorphous state, the method 300 comprises annealing for crystallizing the active selecting layer 1012 in order to make it crystalline.

Annealing is for example performed:
during the filling fifth step 305;
during the damascene ninth step 309, with an annealing temperature equal to 400° C. for example;
during a specific annealing step.

At the end of the manufacturing method 300 according to the third aspect of the invention, the matrix 1000 comprises a plurality of elementary cells 100 each having a device 101 intended to form a selector but not acting as a selector, and an uninitialized memory 102.

Figure 14:
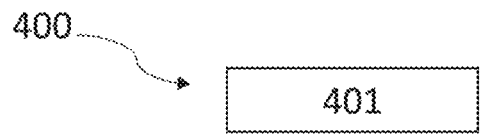
FIG. 14 shows a block diagram representing the step of the initialization method according to the fourth aspect of the invention.

FIG. 14 is a block diagram of an initialization method 400 according to a fourth aspect of the invention. The method 400 initializes an elementary cell 100 or each elementary cell 100 of a matrix 1000.

Step 401 of the method 400 consists in applying an initialization current and a voltage pulse having an intensity equal to a given initialization voltage and a given fall time, to each elementary cell 100 to initialize its memory 102 and to amorphize the active selecting layer 1012 of its device 101.

The initialization current has to be chosen to allow melting of the crystalline active selecting layer 1012, the fall time of the pulse has to be chosen to allow quenching of the active selecting layer 1012 and freezing it in its amorphous phase, and the initialization voltage has to be chosen to allow initialization of the memory 102.

By "fall time of a pulse" it is meant the time required for the pulse to go from 90% of its maximum value to 10% of its maximum value.

The initialization pulse is, for example, a rectangular pulse with a duration of 1 microsecond with a fall time of 10 nanoseconds and an intensity at least equal to the initialization voltage of the memory 102. Biasing the pulse enables initialization of the memory 102.

The pulse current is chosen, for example, so that the current density applied to the active selecting layer 1012 is in the order of $20 \times 10^6$ A/cm².

Figure 15:
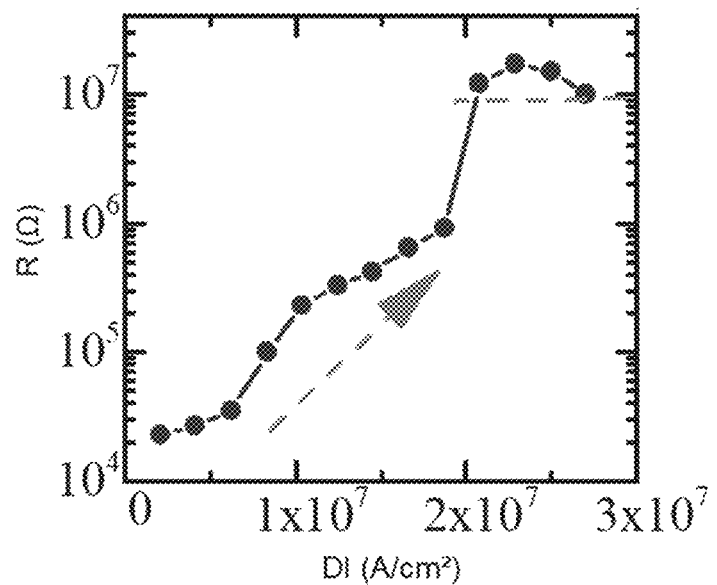
FIG. 15 shows a curve illustrating the resistance of the initially crystalline and conductive active selecting layer of a cell as a function of the current density applied to it, each point being measured after the application of a rectangular pulse having a duration of 1 microsecond.

FIG. 15 represents the resistance R of the active selecting layer 1012 made of an As2Te3+Al+N alloy, as a function of the current density DI applied to it. Each point corresponds to the application of a rectangular pulse with a duration of 1 microsecond.

In FIG. 15, the resistance of the active selecting layer 1012, that is, its amorphization rate increases until it reaches a plateau corresponding to a resistance of $10^7 \Omega$ at around $20 \times 10^6$ A/cm². Thus, by applying a rectangular pulse with a duration of 1 microsecond and a current density of $20 \times 10^6$ A/cm² to the active selecting layer 1012, the latter amorphizes completely.

At the end of step 401 of the method 400, in each cell 100, the active selecting layer 1012 is in an amorphous state and thus the selector device 101 is in its high resistive OFF state, the memory 102 is initialized and its active memory layer 1014 is in its low resistive LRS state.

Figure 16:
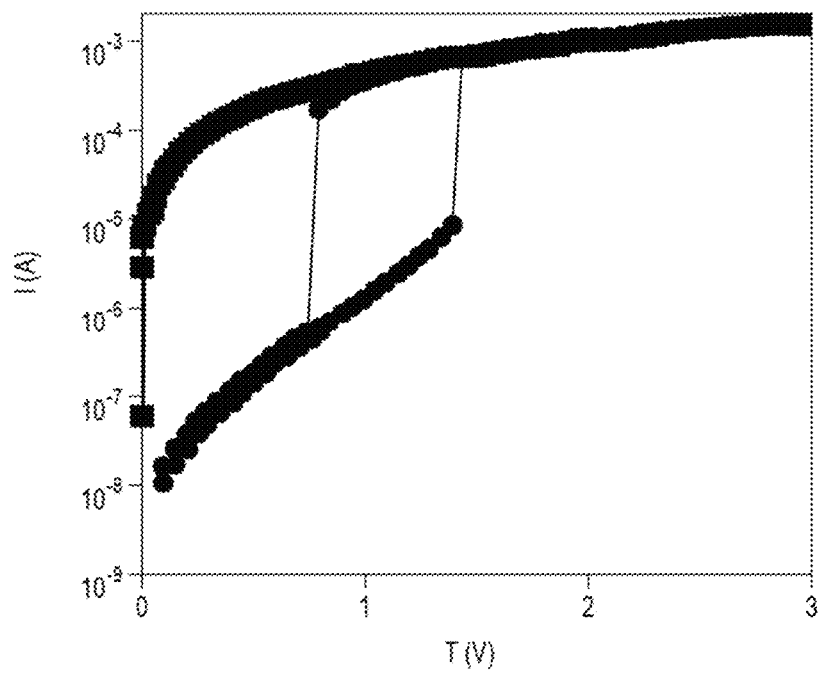
FIG. 16 shows the current flowing through the active selecting layer of an elementary cell as a function of the voltage applied to it, before and after the initialization.

FIG. 16 illustrates the intensity I flowing through the active selecting layer 1012 of an elementary cell 100 as a function of the voltage T applied to it before and after the amorphization of the active selecting layer 1012. Prior to amorphization, the active selecting layer 1012 behaves as a conductive metal, and after amorphization, the active selecting layer 1012 behaves as a selector device, as illustrated in FIG. 2.

Thus, after amorphization, the device 101 operates as a selector device and the cell 100 or matrix 1000 is then operational.

The invention claimed is:

1. An elementary cell comprising a device and a non-volatile resistive memory connected in series, the device comprising:
   a selector upper electrode,
   a selector lower electrode,
   a layer made of a first active material forming an active selecting layer,
   said device being intended to form a volatile selector switching from a first resistive selector state to a second resistive selector state by applying a threshold voltage between the selector upper electrode and the selector lower electrode and switching back to the first resistive selector state as soon as a current flowing through it or a voltage across the selector upper electrode and the selector lower electrode becomes lower again than a holding current or voltage respectively, the first resistive selector state being more resistive than the second resistive selector state,
   said non-volatile resistive memory comprising:
   a memory upper electrode,
   a memory lower electrode,
   a layer made of at least one second active material forming an active memory layer,
   said non-volatile resistive memory switching from a first resistive memory state to a second resistive memory state by applying a voltage or a current between the memory upper electrode and the memory lower electrode,
   wherein said elementary cell is in a configuration in which, both, said active selecting layer is in a conductive crystalline state and said non-volatile resistive memory is in an initial resistive memory state, the initial resistive memory state being a state of the non-volatile resistive memory prior to first use of the elementary cell and being more resistive than the first resistive memory state and the second resistive memory state.

2. The elementary cell according to claim 1, wherein the device is intended to form an OTS type selector.

3. The elementary cell according to claim 1, wherein the non-volatile resistive memory is a PCRAM, OxRAM or CBRAM.

4. The elementary cell according to claim 1, wherein the selector upper electrode is the memory lower electrode.

5. A matrix comprising a plurality of cells according to claim 1, a plurality of upper access lines and a plurality of lower access lines, each cell being located at an intersection between an upper access line and a lower access line allowing its individual addressing.

6. A method for manufacturing a matrix according to claim 5, comprising:
conformally depositing a first dielectric material layer;
manufacturing a plurality of lower metal lines forming the selector lower electrodes of the elementary cells of the matrix, by damascene of the first dielectric material layer;
conformally depositing, on the first dielectric material layer, an active selecting layer in a crystalline state or in an amorphous state, a selector upper electrode layer, a memory lower electrode layer, an active memory layer and then a memory upper electrode layer;
etching at least one first trench with a stop on the first dielectric material layer;
filling with a second dielectric material layer so as to fill in the first trench;
planarizing with a stop on the parts of the memory upper electrode layer that have not been etched;
etching at least one second trench perpendicular to the first trench, with a stop on the first dielectric material layer;
filling with a third dielectric material layer so as to fill in the second trench;
manufacturing a plurality of upper metal lines by damascene on the third dielectric material layer, and
annealing when the active selecting layer is deposited in an amorphous state.

7. The manufacturing method according to claim 6, wherein the annealing is performed during the filling with a second dielectric material layer or during the manufacturing the plurality of upper metal lines.

8. The manufacturing method according to claim 6, further comprising conformally depositing a carbon layer before and after the deposition of the active selecting layer.

9. The manufacturing method according to claim 6, wherein the deposition of the selector upper electrode layer is the deposition of the memory lower electrode layer.

10. A method for initializing an elementary cell including (i) a device and (ii) a non-volatile resistive memory connected in series,
the device including a selector upper electrode, a selector lower electrode, and a layer made of a first active material forming an active selecting layer, said device being intended to form a volatile selector switching from a first resistive selector state to a second resistive selector state by applying a threshold voltage between the selector upper electrode and the selector lower electrode and switching back to the first resistive selector state as soon as a current flowing through it or a voltage across the selector upper electrode and the selector lower electrode becomes lower again than a holding current or voltage respectively, the first resistive selector state being more resistive than the second resistive selector state,
the non-volatile resistive memory including a memory upper electrode, a memory lower electrode, a layer made of at least one second active material forming an active memory layer, said non-volatile resistive memory switching from a first resistive memory state to a second resistive memory state by applying a voltage or a current between the memory upper electrode and the memory lower electrode,
the method comprising:
providing the elementary cell such that, both, said active selecting layer is in a conductive crystalline state and said non-volatile resistive memory is in an initial resistive memory state, the initial resistive memory state being a state of the non-volatile resistive memory prior to first use of the elementary cell and being more resistive than the first resistive memory state and the second resistive memory state, and
applying an initialization current and a single voltage pulse having an intensity equal to a predetermined initialization voltage and predetermined fall time, between the memory upper electrode and the selector lower electrode.

11. The method according to claim 10, wherein the predetermined initialization voltage is selected to allow melting of the crystalline state of the active selecting layer and the predetermined fall time is selected to allow quenching of the active selecting layer, which allows for amorphization of the selector device to place the selector device in its high resistive OFF state.

* * * * *